United States Patent [19]

Suhara et al.

[11] Patent Number: 5,202,948
[45] Date of Patent: Apr. 13, 1993

[54] TRAVELING-WAVE TYPE LIGHT AMPLIFIER

[75] Inventors: Hajime Suhara, Yokohama; Akira Tanioka, Kawaguchi, both of Japan

[73] Assignee: Kabushiki Kaisha Toshiba, Tokyo, Japan

[21] Appl. No.: 788,870

[22] Filed: Nov. 7, 1991

[30] Foreign Application Priority Data

Nov. 8, 1990 [JP] Japan .................... 2-303540

[51] Int. Cl.⁵ .................... G02B 6/10
[52] U.S. Cl. .................... 385/131
[58] Field of Search ........ 372/43, 75, 103; 385/2, 385/8, 40, 41, 49, 130, 131

[56] References Cited

U.S. PATENT DOCUMENTS

| | | | |
|---|---|---|---|
| 4,464,762 | 8/1984 | Furuya | 385/131 |
| 4,855,255 | 8/1989 | Goodhue | 372/43 |
| 4,973,133 | 11/1990 | Matz et al. | 385/49 |

Primary Examiner—John D. Lee
Assistant Examiner—John Ngo
Attorney, Agent, or Firm—Finnegan, Henderson, Farabow, Garret & Dunner

[57] ABSTRACT

Traveling-wave type light amplifier having a waveguide region, both end portions of which are tapered such that the tip of each end has a width and a thickness which are equal to each other. Due to the shape of an end portion of the waveguide region, the output light of the amplifier hardly depends on two linearly polarized wave components. Hence, the near-field pattern of the light-emitting point and the far-field pattern of the output beam are of rotation symmetry. Thus, the light amplifier can be optically coupled to an optical fiber with high efficiency. In addition, since the center portion of the waveguide region has a uniform width, just like the waveguide of the conventional light amplifier, device characteristics such as a current density are not changed.

8 Claims, 3 Drawing Sheets

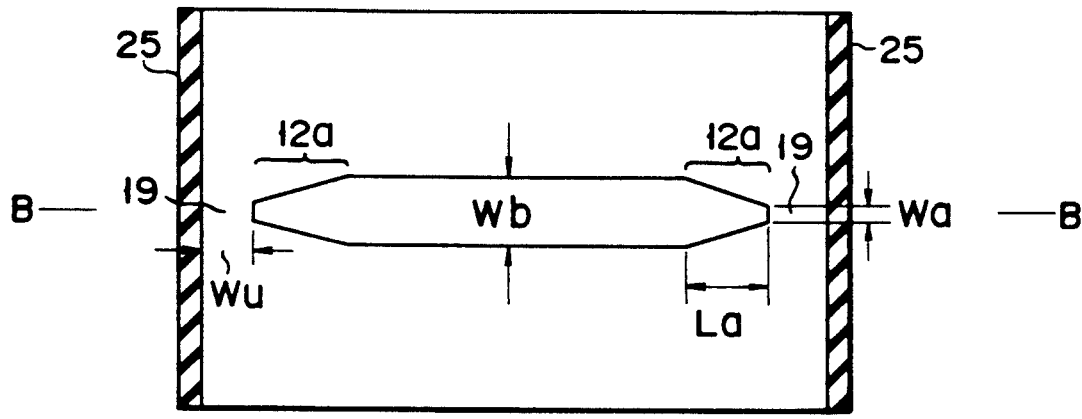
F I G. 4A
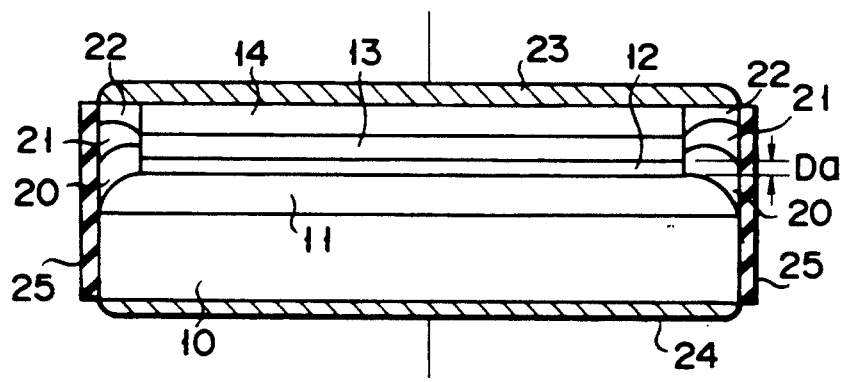
F I G. 4B
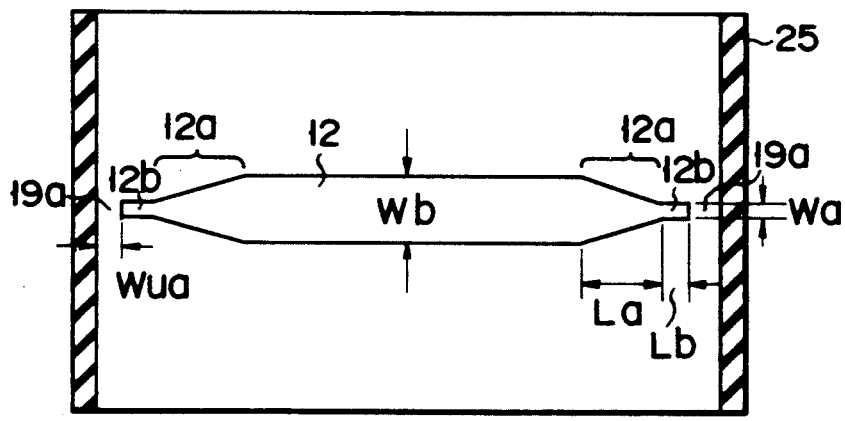
F I G. 5

TRAVELING-WAVE TYPE LIGHT AMPLIFIER

BACKGROUND OF THE INVENTION

1. Field of the Invention

The present invention relates to a traveling-wave type light amplifier which operates stably regardless of the polarization direction of an input light and has a gain characteristic of a wide band range.

2. Description of the Related Art

A light amplifier used in the field of optical communication now attracts more and more attention since it not only can directly amplify an input light, but can also simplify an optical communication system, reduce the cost thereof and improve the reliability thereof. In particular, a traveling-wave type semiconductor light amplifier draws much attention since it has a wide band gain and less dependency upon the wavelength of an incident light.

In a structure of a traveling-wave type light amplifier, it is important to lower reflectance at both ends of the waveguide region so as to suppress the ripples superposed on the output spectrum due to Fabry-Perot resonance. To lower such reflectance, three structures of traveling-wave type light amplifiers are known. A first has an anti-reflection film formed on the reflection surface, i.e., the cleaved end surface of the waveguide region; second has a window formed by cutting the waveguide region before the end portion of the substrate; and a third has both the anti-reflection layer and the window described above.

FIG. 1 is a sectional plan view showing a conventional traveling-wave type light amplifier which has a window structure. A substrate 1 is formed by stacking a plurality of semiconductor layers. A waveguide 2 is formed on the substrate 1, extending in the longitudinal direction of the substrate 1. As shown in FIG. 1, the waveguide 2 is cut near both end portions of the substrate 1 in the longitudinal direction. Window regions 3 are provided on the substrate 1 at both ends of the waveguide 2. Transition regions 2b are formed at both ends of a parallel region 2a having a uniform width to surpress the inner reflection of the traveling-wave from the boundary between the waveguide 2 and the window region 3. The transition regions 2b have been formed by etching the end portions of the waveguide 2 in taper shape (Published Unexamined Japanese Patent Application No. 59-165481). However, under this conventional method, it is impossible to control the thickness and the width of each end portion of the waveguide 2. If an anti-reflection layer (not shown) is formed on a cleaved surface in addition to the window region 3, the reflectance of the light amplifier can be further reduced. The cleaved surface is formed by cleaving the end face of the substrate 1 which opposes to the window region 3. In such a light amplifier, the resultant reflectance is in the order of $10^{-3}$% (see OQ89-17, the Society of Electronic Communication).

In all cases, the width of the end portion of the waveguide 2 and the thickness thereof cannot be the same or of a desired value. The width is defined as the dimension which is perpendicular to the thickness direction and in parallel with the surface of the semiconductor substrate. Thus a cross section of the ends of the waveguide 2 is asymmetrical when the light amplifier is rotated by an angle of 90°. Consequently, two linear polarized wave components extending at right angles to each other, i.e., a transverse electric (TE) wave and a transverse magnetic (TM) wave, are asymmetrical. Since the light outputted from the optical fiber is, in general, used as the incident light to the light amplifier, the polarization surface of the incident light is fluctuated. Hence, the total gain of the light amplifier changes due to the difference between the gain for the TE wave and the gain for the TM wave, as a result of the asymmetry. This gain difference generally ranges from 5 to 7 dB, unless the waveguide is tapered at both ends. Even if the waveguide is tapered at both ends, the difference is as much as 1 dB. Various methods have been proposed to suppress such influence. In one method, a polarization-preserving fiber is used to stabilize the plane of polarization. In another method, two or more light amplifiers are arranged in series or parallel such that the incident lights are amplified while the two linearly polarized wave components extend at right angles to each other. In either method, the optical system design is complicated and it is cumbersome to adjust the optical axes of the various components.

In order to reduce the difference, it has also been proposed that the waveguide can be made to have a width and a thickness which are of the same valve. This method is not recommendable, however, for the following reason. Generally, the waveguide of the light amplifier has a width of about 1 $\mu$m and a thickness of about 0.1 to 0.2 $\mu$m. If the waveguide is made as thick as it is wide, optical confinement is reduced, and its threshold current value is increased. The optical output of the light amplifier will then inevitably decrease and the light amplifier will not achieve a sufficient optical coupling. On the other hand, if the waveguide is made as wide as it is thick, its current density increases so greatly that the light amplifier is not reliable. In practice, it cannot be recommended that the waveguide be made merely to have a width and a thickness which are the same.

In addition, if the width and the thickness of the waveguide at the output end of the light amplifier are of different values, both the near-field pattern of the light-emitting point and the far-field pattern of the output beam will be asymmetrical. Inevitably, the coupling efficiency between the light amplifier and the optical fiber is reduced.

SUMMARY OF THE INVENTION

The object of the present invention is to provide a traveling-wave type light amplifier which has a waveguide region having a low substantial reflectance and which can operate stably with a wide-band gain regardless of the polarization direction of the incident light.

In one aspect of this invention, there is provided a traveling-wave light amplifier which comprises:
- a semiconductor substrate formed by stacking a plurality of semiconductor layers;
- a waveguide region formed on the semiconductor substrate in a stripshape, a length of which is made shorter than the semiconductor substrate, and a plan shape of each end portion of the region being narrowed toward a tip so that a width of the tip corresponds to a thickness thereof; and
- window regions formed on the semiconductor substrate, each contacting an end portion of the waveguide region.

In another aspect of the present invention, there is provided a traveling-wave light amplifier which comprises:

a semiconductor substrate formed by stacking a plurality of semiconductor layers;

a waveguide region formed on the semiconductor substrate in a stripshape, a length of which is made shorter than the semiconductor substrate, and a plan shape of each end portion of the region being narrowed toward a tip so that the width of each tip corresponds to the thickness thereof;

window regions formed on the semiconductor substrate, each contacting an end portion of the waveguide region; and at least one anti-reflection layer formed on at least one end face of the semiconductor substrate, while contacting the window region.

In the light amplifier according to the present invention, the waveguide region has both ends formed in a predetermined shape. Due to the shape of the ends of the waveguide region, the total gain of the light amplifier does not depend on two linearly polarized wave components. Further, the near-field pattern of the light-emitting point and the far-field pattern of the output beam are of rotation symmetry. Thus, the light amplifier can be optically coupled to an optical fiber with high efficiency. In addition, since the center portion of the waveguide region has a uniform width, just like the waveguide of the conventional light amplifier, the device characteristics such as a current density ar not changed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4A is a sectional plan view showing a traveling-wave type light amplifier according to a third embodiment of the present invention;

FIG. 4B is a sectional view of the amplifier shown in FIG. 4A, taken along a line B—B in FIG. 2A; and FIG. 5 is a sectional plan view showing a traveling-wave type light amplifier according to a fourth embodiment of this invention;

DETAILED DESCRIPTION OF THE PREFERRED EMBODIMENTS

Embodiments of the present invention will now be described in detail with reference to the accompanying drawings.

Figure 1:
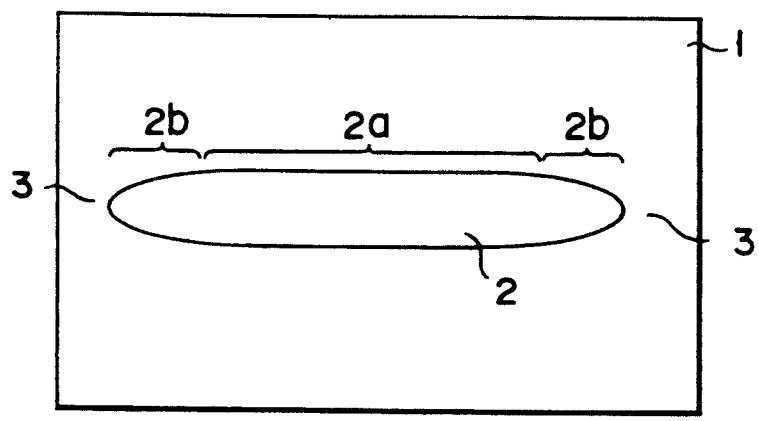
FIG. 1 is a sectional plan view of a conventional traveling-wave type light amplifier.
Figure 2A:
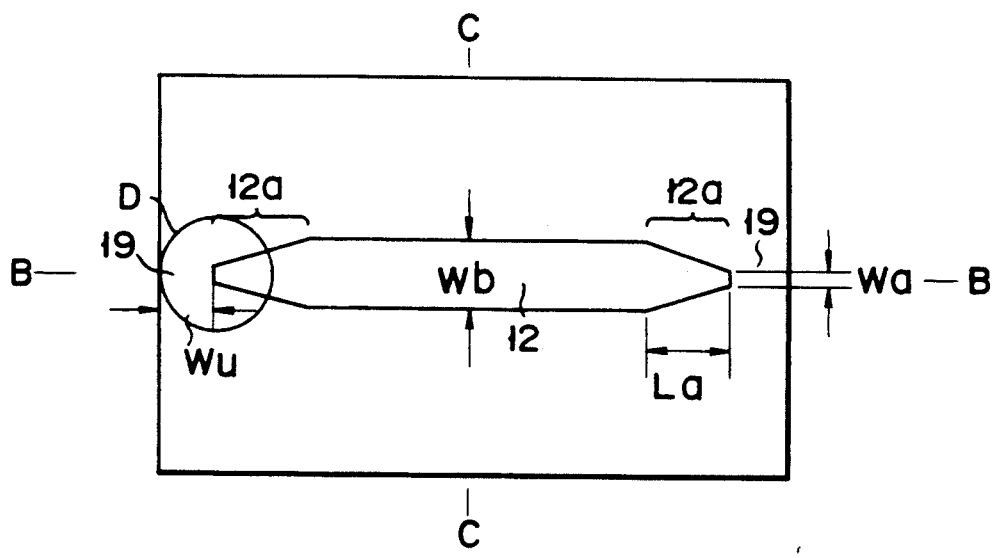
FIG. 2A is a sectional plan view showing a traveling-wave type light amplifier according to a first embodiment of the present invention.
Figure 2B:
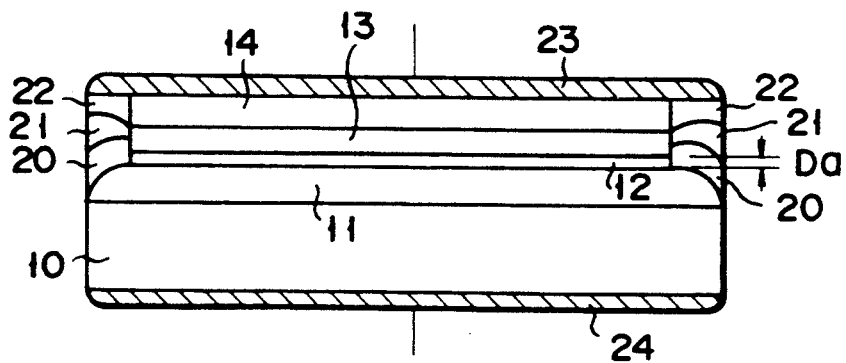
FIG. 2B is a sectional view of the amplifier shown in FIG. 2A, taken along a line B—B in FIG. 2A.
Figure 2C:
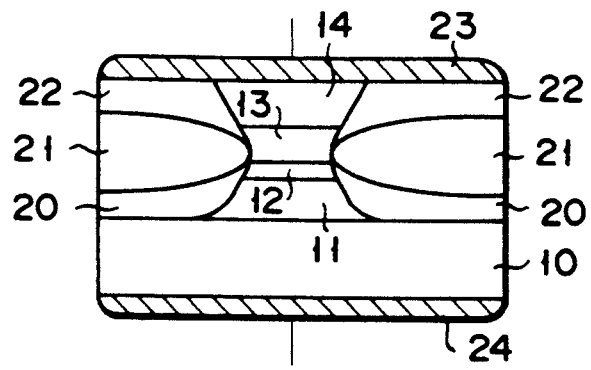
FIG. 2C is a cross-sectional view of the amplifier shown in FIG. 2A, taken along a line C—C in FIG. 2A.

FIG. 2A is a sectional plan view showing a traveling-wave type light amplifier according to a first embodiment of the invention, FIG. 2B is a sectional view of the light amplifier taken along a line B—B in FIG. 2A and FIG. 2C is a cross-sectional view of the light amplifier taken along a line C—C in FIG. 2A. This first embodiment corresponds to a light amplifier having the window structure. As is shown in FIGS. 2A to 2C, the traveling-wave type light amplifier comprises a p-type InP substrate 10, a p-type InP clad layer 11 formed on the substrate 10, an InGaAsP active layer 12 formed on the clad layer 11, an n-type InP clad layer 13 formed on the active layer 12, and an n-type InGaAsP cap layer 14 formed on the clad layer 13. The substrate 10 can be such a multi-layer one as will be described later. The layers 11, 12, 13, and 14 have been formed by means of a liquid-phase epitaxial growth method. The active layer 12, i.e., waveguide region 12, provides an optical confinement of the light signal.

Figure 2D:
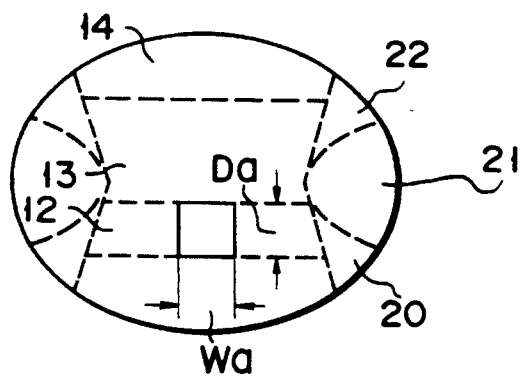
FIG. 2D is an enlarged sectional view of the portion D of the amplifier shown in FIG. 2A.

The structure of the waveguide region 12 shown in FIGS. 2B and 2C may be made by the photolithography technique of the following steps. First, a mask (not shown) covering the active layer 12 shown in FIG. 2A is formed on the cap layer 14 in a region corresponding to a waveguide forming region. Next, the cap layer 14, the clad layer 13, the active layer 12, and the clad layer 11 are removed, except the masked region, by means of isotropic etching or anisotropic etching, as is shown in FIGS. 2A to 2C. A Br-methanol etchant can be used as the isotropic etchant. A reactive etchant gas such as BCl can be applied as the anisotropic etchant. The waveguide region 12 is a strip-shape consisting of a center parallel region and two tapered end regions 12a. The center region has a uniform width Wb of, for example, almost 1 μm. The tip width Wa of the taper region 12a contacting the window region 19 is set to be equal to the thickness Da, for example, 0.1 μm, of the InGaAsP active layer 12, as shown in FIG. 2D.

The waveguide region 12 as a whole is formed shorter than the substrate 10 so that two window regions 9 may be formed on the substrate 10. The length La of the taper region 12a is set to be for example, almost 40 μm. After completing the etching process, the clad layer 11, the clad layer 13 and the cap layer 14 outside of the region corresponding to the waveguide forming region are removed. In practice, a plurality of masks are formed on the cap layer 14, and etching is then performed to form a plurality of waveguide regions 12 at a time. Since, in the present invention, the waveguide region 12 is formed by etching wherein a mask is used, the width Wa and the length La of the taper region 12a can be controlled with precision.

After the etching process, as shown in FIG. 2C, a p-type InP block layer 20, an n-type InP block layer 21 and a p-type InGaAsP ohmic layer 22 are sequentially formed on the substrate 10 by means of a liquid-phase epitaxial growth method so as to bury the waveguide region 12. The block layers 20 and 21 have a larger band gap than the active layer 12 to form the window regions 19. The window regions 19 have length Wu of, for example, 40 μm. Then, a P-side electrode 23 of Au-Zn series material is formed on the cap layer 14 and the p-type InGaAsP ohmic layer 22, whereas an N-side electrode 24 of Au-Zn series material is formed on the exposed surface of the substrate 10. Both electrodes 23 and 24 are formed by means of vacuum deposition or sputtering. Thereafter, the resultant structure is subjected to heat treatments to thus complete wafer-processing steps.

Finally, the p-type InP substrate 10, which has been formed by the various layers, is cleaved in both sides, which function as reflection surfaces. Thus, the traveling-wave type light amplifier is manufactured. The polarization dependence of the light amplifier can be suppressed sufficiently using only the window structure.

Figure 3:
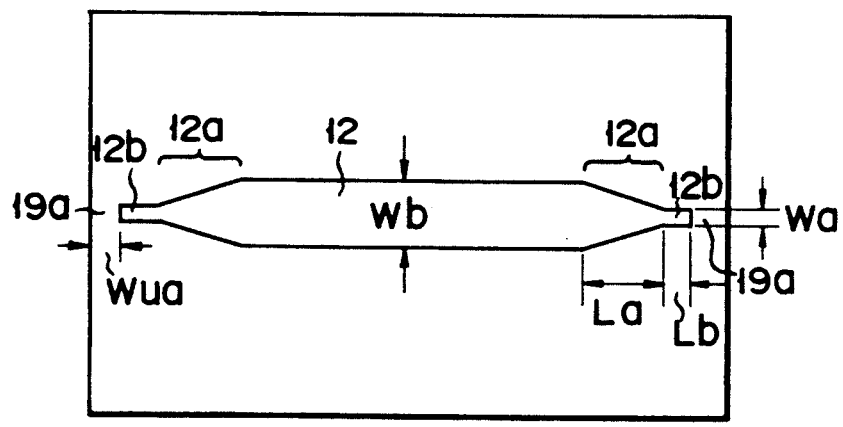
FIG. 3 is a sectional plan view showing a traveling-wave type light amplifier according to a second embodiment of the present invention.

FIG. 3 is a plan sectional view showing a traveling-wave type light amplifier according to a second embodiment of the present invention. The waveguide region 12 of the second embodiment comprises the center parallel region, and the taper regions 12a, as in the first embodiment. However, in the second embodiment, a funnel-shaped tip 12b is provided at the tip of each taper region 12a of the waveguide region 12. The center region has a uniform width, and either taper region 12a gradually narrows toward the tip, as in the first embodiment. The funnel-shaped tip 12b functions as a polarization matching filter and serves not only to suppress the polarization dependence of the light amplifier, but also to reduce the gain difference between the TE wave and the TM wave. The funnel-shaped region 12b has a length Lb or, for example, almost 20 μm. The width and the thickness of the funnel-shaped region 12b are equal to each other and correspond to the width Wa and the thickness Da, for example, 0.1 μm, of the taper region 12a, respectively. The second embodiment shown in FIG. 3 has two window regions 19a which have a length Wua of, for example, almost 20 μm. The light amplifier of FIG. 3 is identical to the first embodiment in all other structural features, and is manufactured in the same method as the first embodiment.

FIG. 4A is a sectional plan view showing a traveling-wave type light amplifier according to a third embodiment of the present invention. FIG. 4B is a sectional view of the amplifier shown in FIG. 4A, taken along line B—B in FIG. 4A. The third embodiment is identical to the first embodiment, except in that two anti-reflection films 25 made of dielectric material are formed on the two cleaved surfaces of the substrate 10 to further lower the reflectance of the traveling-wave at the reflection surface. More specifically, the anti-reflection layer 25 is made of silicon dioxide ($SiO_2$), zirconium dioxide ($ZrO_2$) or the like, and is formed on the cleaved surface by means of vacuum vapor deposition or sputtering. The same effect as in the case where the amplifier has two anti-reflection layers 25 can be obtained by providing an anti-reflection layer 25 on only one cleaved surface. The light amplifier shown in FIGS. 4A and 4B are identical to the first embodiment in all other structural features and is manufactured by the same method as the first embodiment.

FIG. 5 is a sectional plan view showing a traveling-wave type light amplifier according to a fourth embodiment of this invention. As can be understood from FIG. 5, this light amplifier is identical to the second embodiment (FIG. 3), except that two anti-reflection layers 25 are formed on the two cleaved surfaces of the substrate. The waveguide region 12 consists of a center region, two taper 12a, and two funnel-shaped tips 12b, as in the light amplifier according to the second embodiment.

The inventors hereof made a traveling-wave light amplifier of the type shown in FIG. 5, and analyzed the emission spectrum of this amplifier. It was then found that the amplifier had a reflectance of 0.01% or less, which is far less than the maximum value allowed for a practical traveling-wave type light amplifier. Further, the gain of this light amplifier was measured, taking into account the connection loss between the amplifier and the input and output optical fibers. The amplifier had a gain of 15.1 dB for the TE wave, and 15.2 dB for the TM wave. Obviously, the polarization dependence of the light amplifier could be improved, and the TE-TM gain difference of the light amplifier was extremely reduced. Hence, the near-field pattern of the light-emitting point located at the output end had an improved rotation symmetry. In addition, the far-field pattern of the output beam had an aspect ratio of about 1:1 to improve its rotation symmetry. Therefore, the light amplifier could be coupled with optical fibers with an efficiency improved to −4 dB to −5 dB.

As has been described, the present invention provides a traveling-wave type light amplifier whose gain depends little on the difference between the gain for one linearly polarized wave component and the gain for another linearly polarized wave component, and which can be coupled to optical fibers with high efficiency.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A traveling-wave type light amplifier comprising:
   a semiconductor substrate formed by stacking a plurality of semiconductor layers;
   a waveguide region formed on the semiconductor substrate in a strip shape, the waveguide region including end portions and having a length shorter than that of the semiconductor substrate, a plane shape of each end portion being narrowed to form a tip so that a width of the tip is equal to a thickness thereof; and
   window regions formed on the semiconductor substrate, each window region contacting a corresponding end portion of the waveguide region.

2. The light amplifier according to claim 1, wherein the plan shape of each end portion of the waveguide region is formed in a taper.

3. The light amplifier according to claim 1, wherein the plan shape of each end portion of the waveguide region consists of a taper region and a funnel-shaped region connected to the taper region.

4. A traveling-wave type light amplifier comprising:
   a semiconductor substrate formed by stacking a plurality of semiconductor layers;
   a waveguide region formed on the semiconductor substrate in a strip shape, the waveguide region including end portions and having a length shorter than that of the semiconductor substrate, a plan shape of each end portion being narrowed to form a tip so that a width of the tip is equal to a thickness thereof;
   window regions formed on the semiconductor substrate, each window region contacting a corresponding end portion of the waveguide region; and an anti-reflection layer formed on at least one end face of the semiconductor substrate while contacting a corresponding window region.

5. The light amplifier according to claim 4, wherein the plan shape of each end portion of the waveguide region is formed in a taper.

6. The light amplifier according to claim 4, wherein the plan shape of each end portion of the waveguide region consists of a taper region and a funnel-shaped region connected to the taper region.

7. The light amplifier according to claim 4, wherein the anti-reflection layer is formed on only one end face of said semiconductor substrate.

8. The light amplifier according to claim 4, wherein the anti-reflection layer is formed on two end faces of said semiconductor substrate.

* * * * *

UNITED STATES PATENT AND TRADEMARK OFFICE
CERTIFICATE OF CORRECTION

PATENT NO. : 5,202,948
DATED : April 13, 1993
INVENTOR(S) : Hajime Suhara et al.

It is certified that error appears in the above-indentified patent and that said Letters Patent is hereby corrected as shown below:

On the title page, Attorney, Agent, or Firm, change "Garret" to --
-- Garrett--.

Claim 1, column 6, line 42, change "plane" to --plan--.

Signed and Sealed this

Nineteenth Day of April, 1994

Attest:

BRUCE LEHMAN

Attesting Officer

Commissioner of Patents and Trademarks